(12) United States Patent
Chai et al.

(10) Patent No.: US 9,743,535 B2
(45) Date of Patent: Aug. 22, 2017

(54) ELECTRONIC DEVICE ENCLOSURE WITH REAR COVER

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Chung Chai, New Taipei (TW); Da-Long Sun, Wuhan (CN); Yu-Gui Chen, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 820 days.

(21) Appl. No.: 14/225,940

(22) Filed: Mar. 26, 2014

(65) Prior Publication Data

US 2014/0375184 A1 Dec. 25, 2014

(30) Foreign Application Priority Data

Jun. 21, 2013 (CN) .......................... 2013 1 02489681

(51) Int. Cl.
| | |
|---|---|
| *H05K 5/00* | (2006.01) |
| *G06F 1/18* | (2006.01) |
| *G06F 1/16* | (2006.01) |
| *F16B 5/06* | (2006.01) |
| *F16B 35/04* | (2006.01) |
| *F16B 37/12* | (2006.01) |

(52) U.S. Cl.
CPC ......... *H05K 5/0008* (2013.01); *G06F 1/1656* (2013.01); *G06F 1/181* (2013.01); *F16B 5/065* (2013.01); *F16B 5/0657* (2013.01); *F16B 35/048* (2013.01); *F16B 37/122* (2013.01)

(58) Field of Classification Search
CPC ..... H05K 5/0008; G06F 1/1656; G06F 1/181; F16B 37/122; F16B 5/0657; F16B 35/048; F16B 5/065
See application file for complete search history.

(56) References Cited

U.S. PATENT DOCUMENTS

| 7,894,182 B2* | 2/2011 | Wang | G06F 1/1605 349/56 |
| 8,367,926 B2* | 2/2013 | Peng | H01R 13/5213 174/17 R |
| 8,542,482 B2* | 9/2013 | Hsiung | H01H 13/705 200/341 |

(Continued)

*Primary Examiner* — Jinhee Lee
*Assistant Examiner* — Abhishek Rathod
(74) *Attorney, Agent, or Firm* — Steven Reiss (57) ABSTRACT

An electronic device enclosure includes a rear cover, a securing bracket, and a securing assembly. The rear cover includes a hook. The securing bracket includes a latching portion engaged with the hook. The securing assembly includes a securing member and a sliding shaft. The securing member is secured to the securing bracket. The mounting member is movable relative to the securing bracket to slide the sliding shaft. The sliding shaft presses edges of the limiting slot to push the rear cover away from the securing bracket to disengage the hook from the latching portion when sliding.

20 Claims, 9 Drawing Sheets

(56) References Cited

U.S. PATENT DOCUMENTS

| | | | |
|---|---|---|---|
| 2005/0185370 A1* | 8/2005 | Chung | G06F 1/181 361/679.56 |
| 2012/0028485 A1* | 2/2012 | Liu | H01R 13/447 439/142 |
| 2012/0321117 A1* | 12/2012 | Chen | H04R 1/028 381/333 |
| 2013/0147324 A1* | 6/2013 | Chen | G06F 1/181 312/223.1 |

* cited by examiner

ELECTRONIC DEVICE ENCLOSURE WITH REAR COVER

FIELD

Embodiments of the present disclosure relate to electronic device enclosures, and particularly to an electronic device enclosure with a removable rear cover.

BACKGROUND

In many electronic device enclosures, in disassembly of a rear cover, first a tool is used to remove screws from the rear cover, and then the rear cover is pried to disengage from other components, which may damage the rear cover or the other components and be inconvenient. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
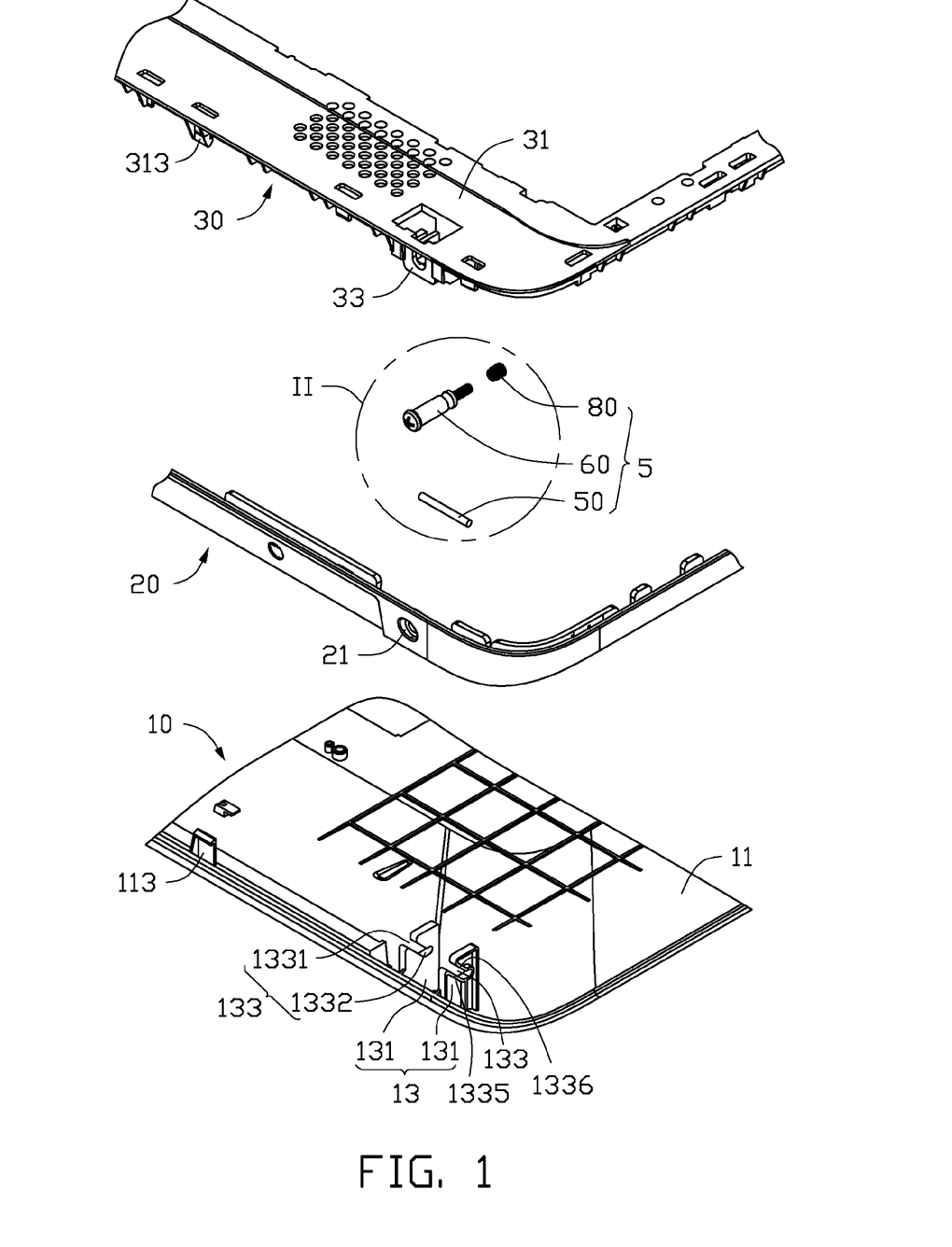
FIG. 1 is an exploded, isometric view of one embodiment of a portion of an electronic device enclosure.
Figure 2:
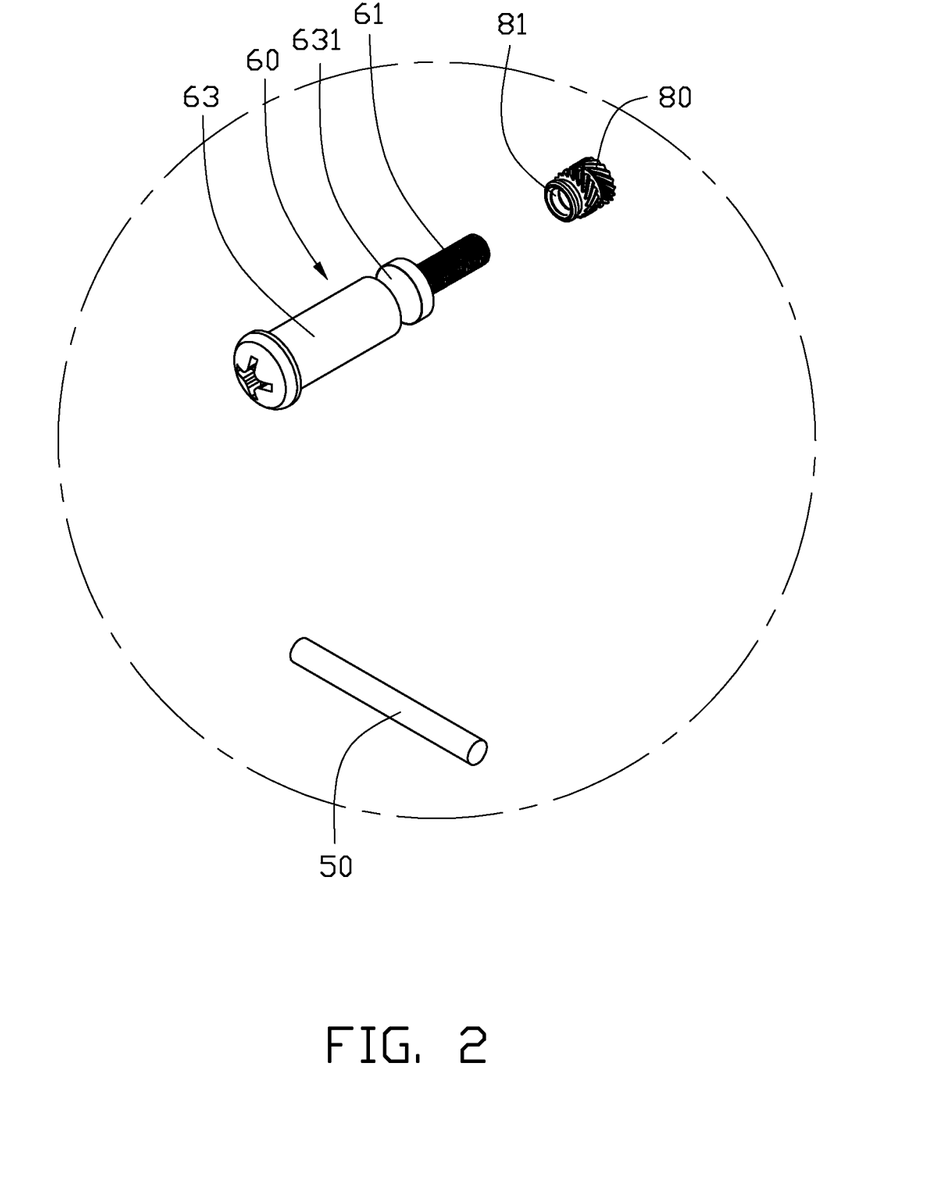
FIG. 2 is an enlarged view of a circled portion II of the portion of the electronic device enclosure of FIG. 1.

FIG. 1 and FIG. 2 show one embodiment of a portion of an electronic device enclosure. The electronic device enclosure includes a rear cover 10, a frame 20, an installation bracket 30, and a plurality of securing assemblies 5 (only one of the plurality of securing assemblies 5 is shown).

The rear cover 10 includes a covering plate 11, a limiting assembly 13 extending from the covering plate 11, and a plurality of hooks 113 located on a side of the covering plate 11. The limiting assembly 13 includes two opposite limiting pieces 131. Each limiting piece 131 defines a limiting slot 133. The limiting slot 133 includes a limiting portion 1331 and a receiving portion 1332. An extending direction of the receiving portion 1332 is substantially parallel to the covering plate 11. An angle is defined between an extending direction of the limiting portion 1331 and that of the receiving portion 1332. In one embodiment, the limiting piece 131 is substantially perpendicular to the covering plate 11, and the angle is obtuse. The limiting portion 1331 has a first edge 1335 and a second edge 1336. In one embodiment, the first edge 1335 is substantially parallel to the second edge 1336, and an obtuse angle is defined between the first edge 1335 and the covering plate 11.

The frame 20 defines a through hole 21 corresponding to the securing assembly 5.

Figure 3:
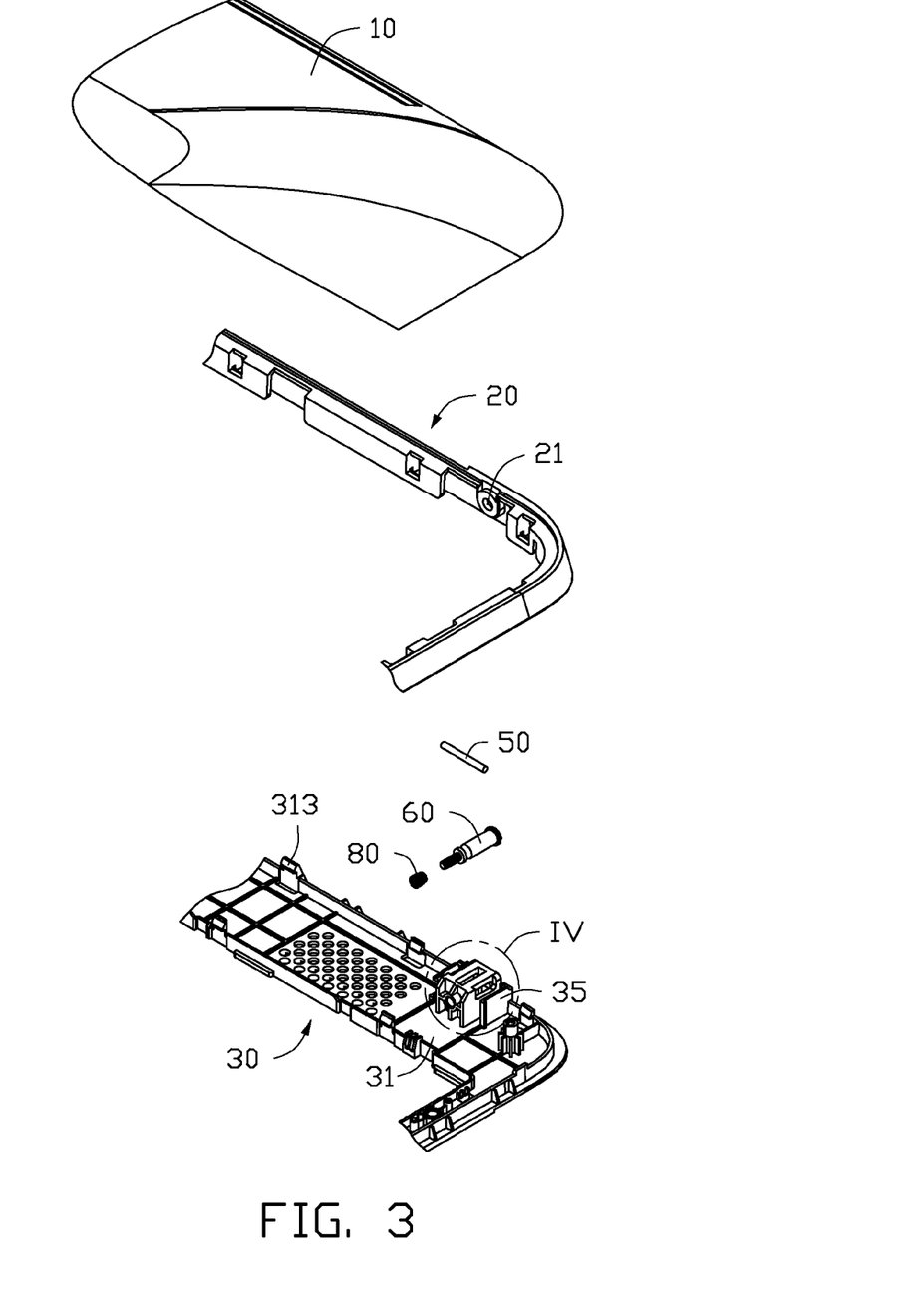
FIG. 3 is similar to FIG. 2, but viewed from a different aspect.
Figure 4:
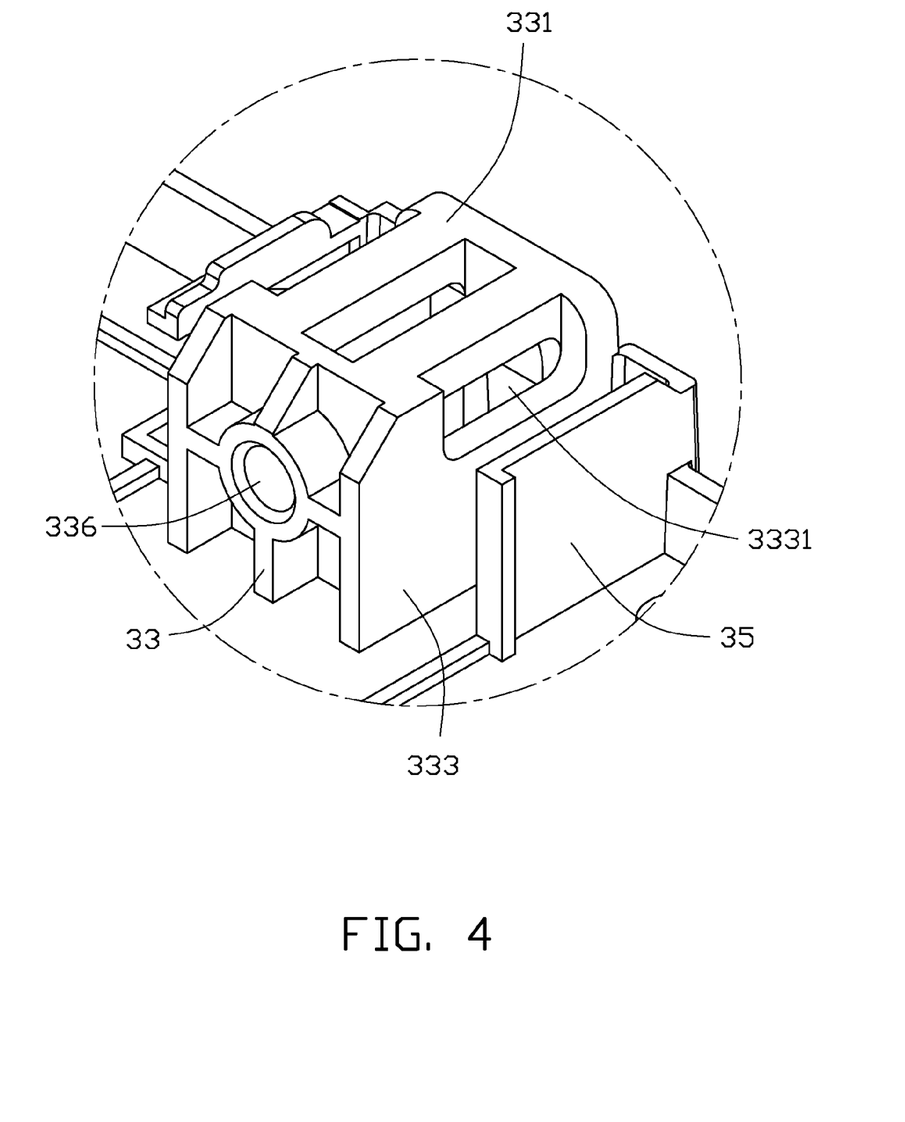
FIG. 4 is an enlarged view of a circled portion IV of the portion of the electronic device enclosure of FIG. 1.
Figure 5:
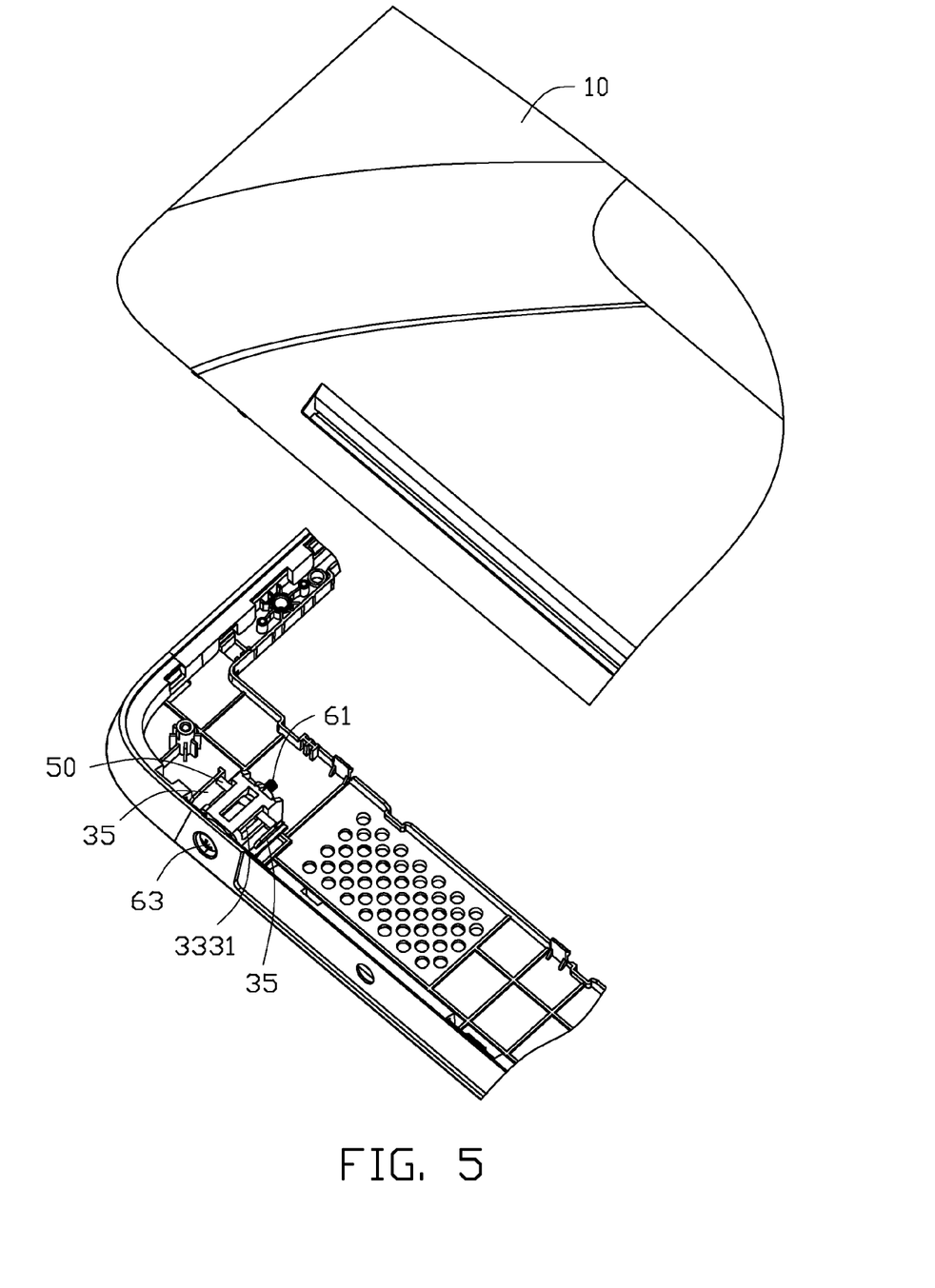
FIG. 5 is a partially assembled, isometric view of the portion of the electronic device enclosure of FIG. 3.
Figure 6:
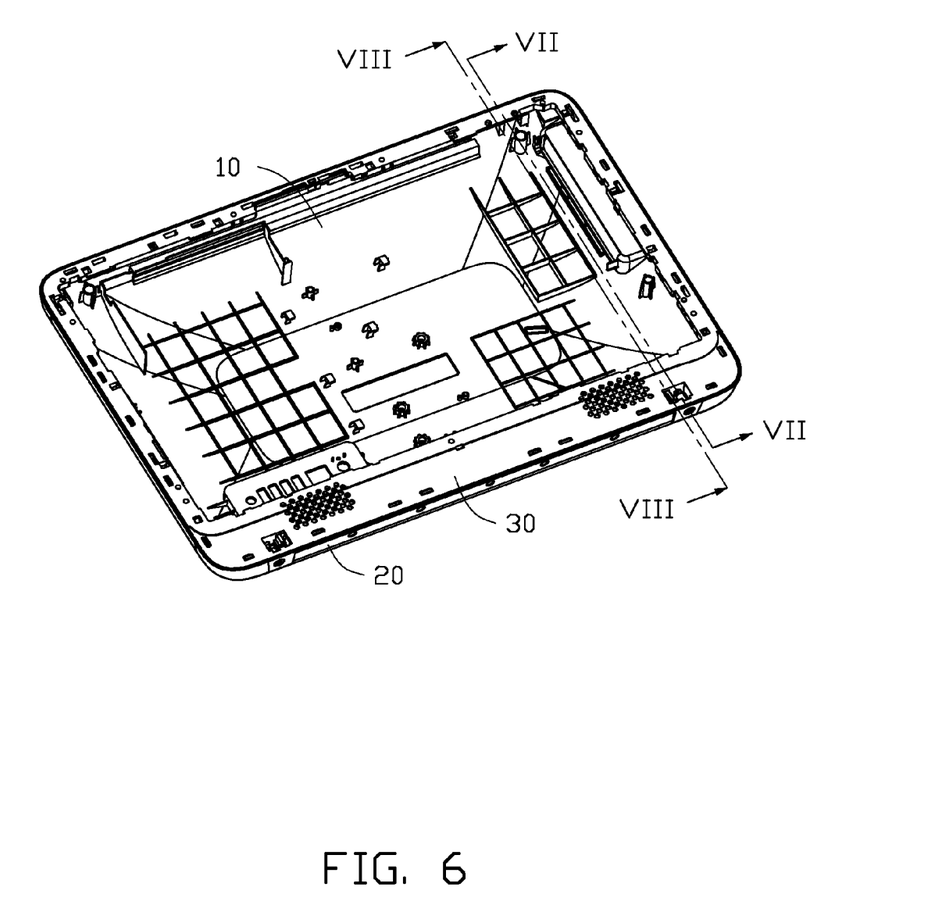
FIG. 6 is an assembled, isometric view of one embodiment of the portion of the electronic device enclosure of FIG. 1.
Figure 7:
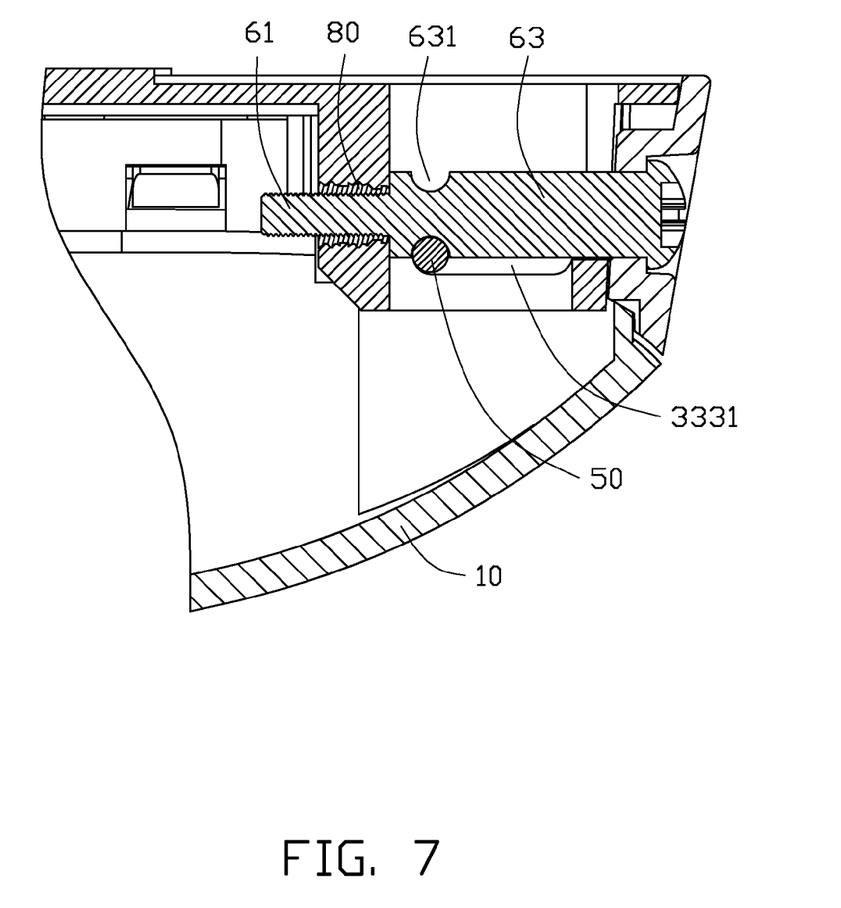
FIG. 7 is a cross sectional view of FIG. 6, taken along a line VII-VII.
Figure 8:
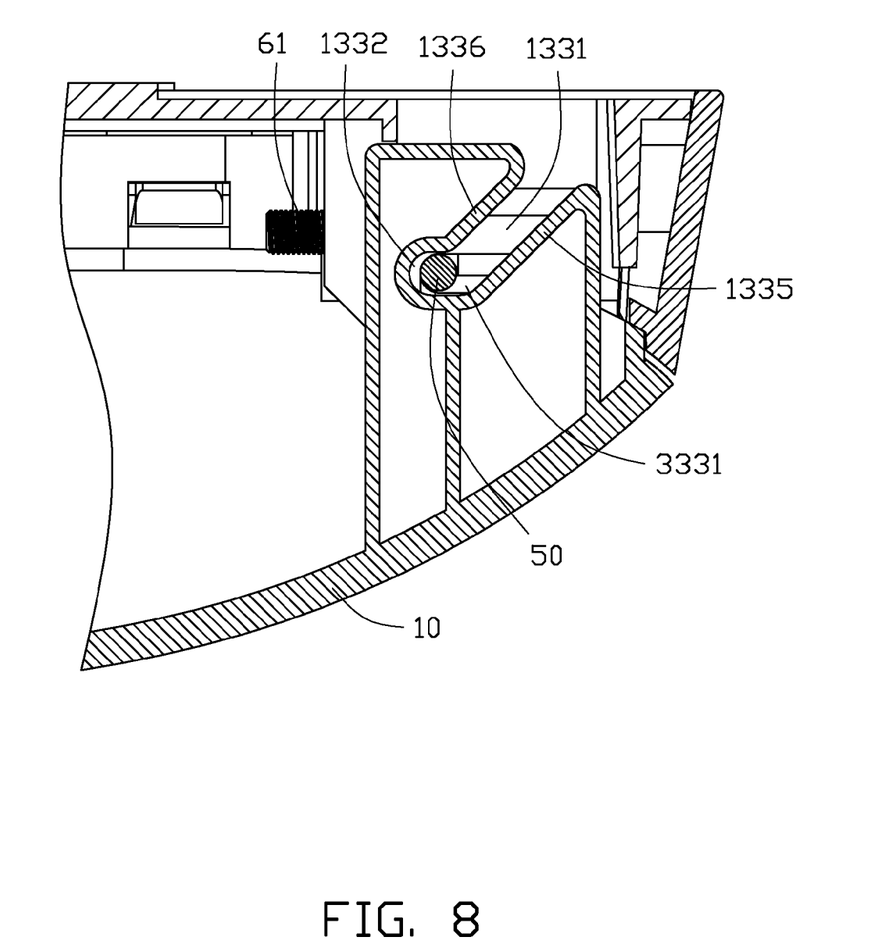
FIG. 8 is a cross sectional view of FIG. 6, taken along a line VIII-VIII showing a rear cover engaged with an installation bracket.

FIG. 3 and FIG. 4 show that the installation bracket 30 includes an installation plate 31, an installation portion 33 extending from the installation plate 31, two positioning pieces 35 extending from the installation plate 31, and an installation end 336. A plurality of latching portions 313 are located on the installation plate 31 corresponding to the hooks 113. The installation portion 33 includes a top wall 331 and two opposite sidewalls 333. The top wall 331 is substantially perpendicular to the sidewall 333. The installation portion 33 defines a sliding slot 3331 extending through the two sidewalls 333. The two positioning pieces 35 are located on opposite sides of the installation portion 33 and substantially parallel to the sidewall 333.

FIGS. 1-4 show that the securing assembly 5 includes a sliding shaft 50, a securing member 60, and an installation member 80.

A length of the sliding shaft 50 is smaller than a distance between the two positioning pieces 35 and greater than a distance between the two sidewalls 333.

The securing member 60 includes a threaded end 61 and an operation end 63. The threaded end 61 includes a plurality of outer threads. The operation end 63 defines a securing slot 631. The securing slot 631 is annular surrounding the operation end 63. The securing slot 631 is used for receiving the sliding slot 50.

The installation member 80 can be installed in the installation end 336 and defines a threaded hole 81.

FIGS. 5-8 show that in assembly, the frame 20 is secured to the installation bracket 30. The installation member 80 is mounted in the installation end 336. The securing member 60 is rotatably received in the installation portion 33 through the through hole 21, and the threaded end 61 is rotatably received in the threaded hole 81. The sliding shaft 50 is positioned in the securing slot 631 through the sliding slot 3331 and located between the two positioning pieces 35. In this position, the securing member 60 is rotatable to revolve into the threaded hole 81 or revolve out of the threaded hole 81, so that the securing member 60 is movable relative to the installation bracket 30 in a direction substantially parallel to the installation plate 31 when rotated and moves the sliding shaft 50 in the sliding slot 3331. When the threaded end 61 is revolved out of the threaded hole 81, the securing member 60 moves outwards to slide the sliding shaft 50 to abut an edge of the sliding slot 3331, which is adjacent to the frame 20. The rear cover 10 is moved to place the limiting piece 131 between the sidewall 333 and the positioning piece 35 and align the hook 113 with the latching portion 313. In this position, the sliding shaft 50 is received in an opening of the limiting portion 1331 (shown as in FIG. 9). When the threaded end 61 is revolved into the threaded hole 81, the securing member 60 moves outwards to slide the sliding shaft 50 in the limiting portion 1331, the sliding shaft 50 presses the second edge 1336 to move the rear cover 10 towards the installation bracket 30, so that the hooks 113 are engaged with the latching portions 313. The rear cover 10 is secured to the installation bracket 30 when the sliding shaft 50 slides from the limiting portion 1331 to the receiving portion 1332.

In other embodiments, the securing member 60 is a sliding mounting bracket 30 by other means, such as a sling slot and a sliding rail, not limit by the threaded end 61 and the threaded hole 81.

Figure 9:
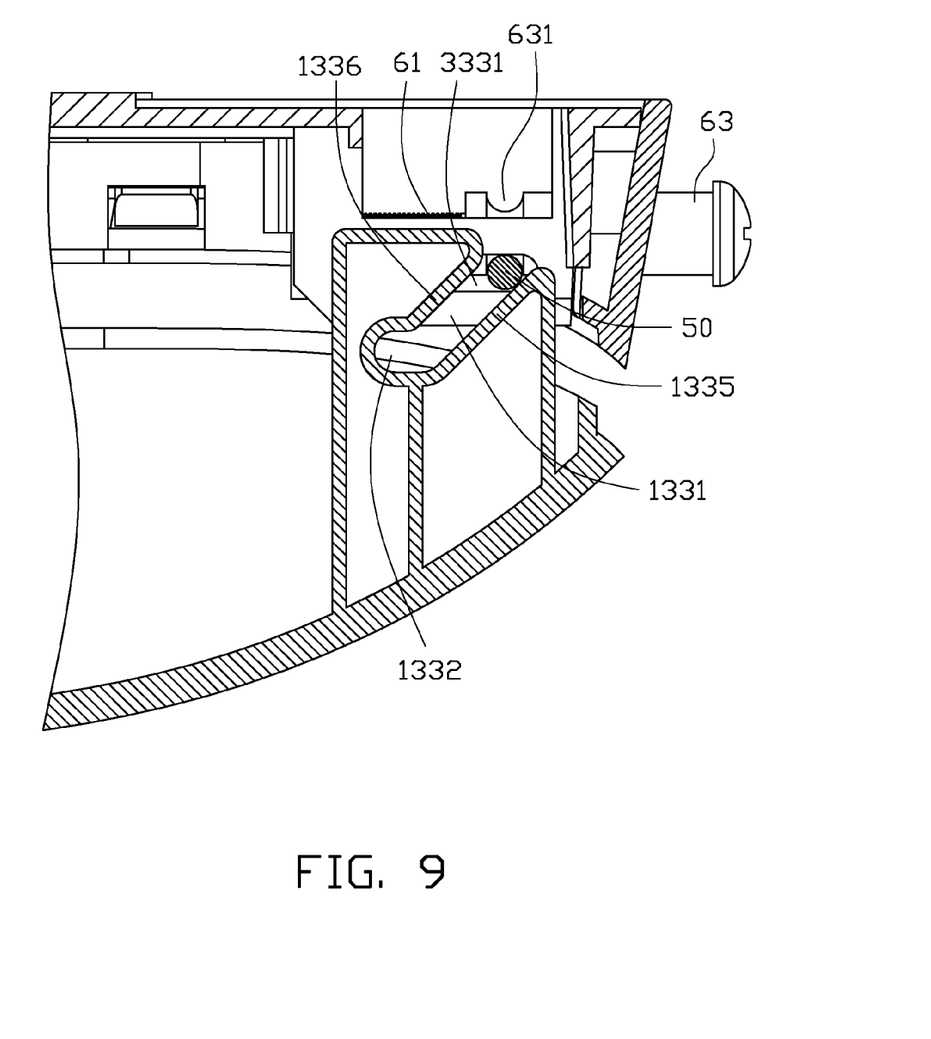
FIG. 9 is similar to FIG. 8, but showing the rear cover disengaged from the installation bracket.

FIG. 9 shows that during disassembly, the securing member 60 is rotated outwards to move the sliding shaft 50, the sliding shaft 50 slides from the receiving portion 1332 to the limiting portion 1331 and pushes the first edge 1335, and then the rear cover 10 away from the installation bracket 30 to disengage the hooks 113 from the latching portions 313.

It is to be understood that even though numerous characteristics and advantages have been set forth in the foregoing description of embodiments, together with details of the structures and functions of the embodiments, the disclosure is illustrative only and changes may be made in detail, especially in the matters of shape, size, and the arrangement of parts within the principles of the disclosure, to the full extent indicated by the broad general meaning of the terms in which the appended claims are expressed.

What is claimed is:

1. An electronic device enclosure, comprising:
   a rear cover comprising a hook and defining a limiting slot;
   an installation bracket defining a sliding slot and comprising a latching portion engaged with the hook; and
   a securing assembly comprising a securing member secured to the installation bracket and a sliding shaft slidably received in the sliding slot;
   wherein a part of the sliding shaft is received in the securing member; the sliding shaft is received in the limiting slot; the securing member is movable relative to the installation bracket to slide the sliding shaft in the sliding slot, and the sliding shaft presses an edge of the limiting slot to push the rear cover away from the installation bracket, to disengage the hook from the latching portion.

2. The electronic device enclosure of claim 1, wherein the limiting slot comprises a receiving portion and a limiting portion, and the limiting portion is oblique relative to the sliding slot;
   the sliding shaft is received in the receiving portion; and
   the sliding shaft is slidable in the limiting potion relative to the installation bracket.

3. The electronic device enclosure of claim 2, wherein an extending direction of the receiving portion is substantially parallel to en extending direction of the sliding slot; and
   an obtuse angle is defined between an extending direction of the limiting portion and the extending direction of the receiving portion.

4. The electronic device enclosure of claim 2, wherein the installation bracket comprises an installation plate and an installation portion extending from the installation plate;
   the installation portion comprises two sidewalls;
   the sliding slot extends out of the two sidewalls; and
   the sliding shaft extends through the two sidewalls.

5. The electronic device enclosure of claim 4, wherein the installation bracket further comprises two positioning pieces for preventing the sliding shaft from sliding out of the sliding slot;
   the installation portion is located between the two positioning pieces;
   a length of the sliding slot is greater than a distance between the two sidewalls and smaller than a distance between the two positioning pieces.

6. The electronic device enclosure of claim 5, wherein the rear cover comprises a limiting piece, and the limiting slot is defined in the limiting piece; and
   the limiting piece is located between one of the two positioning pieces and one of the two sidewalls adjacent to the one of the two positioning pieces.

7. The electronic device enclosure of claim 1, wherein the securing assembly further comprises an installation member secured to the installation bracket; and
   the securing member is rotatably mounted to the installation member.

8. The electronic device enclosure of claim 7, wherein the securing member comprises a threaded end, and the installation member defines a threaded hole corresponding to the threaded end.

9. The electronic device enclosure of claim 7, wherein the securing member further comprises an operation end, the operation end defines a securing slot, and the part of the sliding shaft is received in the securing slot.

10. The electronic device enclosure of claim 9, wherein the securing slot is annular surrounding the operation end.

11. An electronic device enclosure, comprising:
    a rear cover comprising a hook and defining a limiting slot;
    an installation bracket defining a sliding slot and comprising a latching portion; and
    a securing assembly comprising a securing member secured to the installation bracket and a sliding shaft slidably received in the sliding slot;
    wherein a part of the sliding shaft is received in the securing member;
    the sliding shaft is received in the limiting slot;
    the securing member is movable relative to the installation bracket in a first direction or a second direction;
    when the securing member is moved in the first direction, the securing member slides the sliding shaft in the first direction, and the sliding shaft presses a first edge of the limiting slot to move the rear cover towards the installation bracket, to engage the hook with the latching portion; and
    when the securing member is moved in the second direction, the securing member slides the sliding shaft in the second direction, and the sliding shaft presses a second edge of the limiting slot to move the rear cover away from the installation bracket, to disengage the hook from the latching portion.

12. The electronic device enclosure of claim 11, wherein the limiting slot comprises a receiving portion and a limiting portion, and the limiting portion is oblique relative to the sliding slot;
    the sliding shaft is received in the receiving portion; and
    the sliding shaft is slidable in the limiting potion relative to the installation bracket.

13. The electronic device enclosure of claim 12, wherein an extending direction of the receiving portion is substantially parallel to en extending direction of the sliding slot; and
    an obtuse angle is defined between an extending direction of the limiting portion and the extending direction of the receiving portion.

14. The electronic device enclosure of claim 12, wherein the installation bracket comprises an installation plate and an installation portion extending from the installation plate;
    the installation portion comprises two sidewalls;

the sliding slot extends out of the two sidewalls; and the sliding shaft extends through the two sidewalls.

15. The electronic device enclosure of claim 14, wherein the installation bracket further comprises two positioning pieces for preventing the sliding shaft from sliding out of the sliding slot;

the installation portion is located between the two positioning pieces;

a length of the sliding slot is greater than a distance between the two sidewalls and smaller than a distance between the two positioning pieces.

16. The electronic device enclosure of claim 15, wherein the rear cover comprises a limiting piece, and the limiting slot is defined in the limiting piece; and the limiting piece is located between one of the two positioning pieces and one of the two sidewalls adjacent to the one of the two positioning pieces.

17. The electronic device enclosure of claim 11, wherein the securing assembly further comprises an installation member secured to the installation bracket; and the securing member is rotatably mounted to the installation member.

18. The electronic device enclosure of claim 17, wherein the securing member comprises a threaded end, and the installation member defines a threaded hole corresponding to the threaded end.

19. The electronic device enclosure of claim 17, wherein the securing member further comprises an operation end, the operation end defines a securing slot, and the part of the sliding shaft is received in the securing slot.

20. The electronic device enclosure of claim 19, wherein the securing slot is annular surrounding the operation end.

* * * * *